United States Patent [19]
Gardner et al.

[11] Patent Number: 5,869,379
[45] Date of Patent: Feb. 9, 1999

[54] METHOD OF FORMING AIR GAP SPACER FOR HIGH PERFORMANCE MOSFETS'

[75] Inventors: Mark I. Gardner, Cedar Creek; Daniel Kadosh; Michael P. Duane, both of Austin, all of Tex.

[73] Assignee: Advanced Micro Devices, Inc.

[21] Appl. No.: 987,116

[22] Filed: Dec. 8, 1997

[51] Int. Cl.$^6$ .................................................. H01L 21/336
[52] U.S. Cl. ......................... 438/305; 438/182; 438/319; 438/421; 438/574
[58] Field of Search .................................... 438/176, 182, 438/201, 230, 303, 305, 306, 315, 316, 319, 320, 366, 397, 411, 421, 422, 555, 574, 579, 593, 619, 630, 944; 148/DIG. 73

[56] References Cited

U.S. PATENT DOCUMENTS

| | | |
|---|---|---|
| 4,182,023 | 1/1980 | Cohen et al. ............................ 438/555 |
| 4,675,074 | 6/1987 | Wada et al. . |
| 4,899,439 | 2/1990 | Potter et al. . |
| 4,920,639 | 5/1990 | Yee . |
| 5,001,079 | 3/1991 | Van Laarhoven et al. . |
| 5,117,276 | 5/1992 | Thomas et al. . |
| 5,182,225 | 1/1993 | Matthews . |
| 5,241,193 | 8/1993 | Pfiester et al. . |
| 5,272,100 | 12/1993 | Satoh et al. ............................. 438/305 |
| 5,310,700 | 5/1994 | Lien et al. ............................... 438/422 |
| 5,324,683 | 6/1994 | Fitch et al. . |
| 5,386,142 | 1/1995 | Kurtz et al. . |
| 5,393,709 | 2/1995 | Lur et al. . |
| 5,407,860 | 4/1995 | Stoltz et al. . |
| 5,426,072 | 6/1995 | Finnila . |

(List continued on next page.)

FOREIGN PATENT DOCUMENTS

| | | |
|---|---|---|
| 63-179548 | 7/1988 | Japan . |
| 1-296641 | 11/1989 | Japan . |
| 5-206120 | 8/1993 | Japan . |
| 5-335475 | 12/1993 | Japan . |

OTHER PUBLICATIONS

Wolf, "Silicon Processing for the VLSI Era—vol. 2," 1990 Ed., p. 198.

*Primary Examiner*—Charles Bowers
*Assistant Examiner*—Jack Chen
*Attorney, Agent, or Firm*—Kevin L. Daffer; Conley, Rose & Tayon

[57] ABSTRACT

A method is provided for forming a transistor in which capacitive coupling between the gate conductors and adjacent structures employed by the integrated circuit is reduced. According to an embodiment, a gate conductor is dielectrically spaced above a semiconductor substrate, and a masking structure is arranged upon an upper surface of the gate conductor. A source/drain implant self-aligned to opposed lateral sidewalls of the masking structure is performed to form source/drain implant areas within the substrate. Select portions of the gate conductor are removed such that opposed ends of the masking structure extend beyond opposed sidewall surfaces of the gate conductor. A lightly doped drain implant self-aligned to the opposed sidewall surfaces of the narrowed gate conductor is performed to form lightly doped drain implant areas within the substrate. An interlevel dielectric is deposited to a level above the gate conductor across the semiconductor topography such that air gaps are formed laterally adjacent the opposed sidewall surfaces of the gate conductor, and the interlevel dielectric is planarized to a level substantially coplanar with an upper surface of the masking structure. In an alternative embodiment, a refractory metal is deposited across an upper surface of the masking structure and across the source/drain implant areas subsequent to forming said source/drain implant areas. The refractory metal is heated to form a metal silicide overlying the source/drain implant areas and residual refractory metal is removed from above the masking structure. In yet another alternative embodiment, a single high-energy ion implant is used to simultaneously form the source/drain implant area and the lightly doped drain implant area following removal of select portions of the gate conductors.

12 Claims, 3 Drawing Sheets

U.S. PATENT DOCUMENTS

| | | |
|---|---|---|
| 5,444,015 | 8/1995 | Aitken et al. . |
| 5,451,804 | 9/1995 | Lur et al. . |
| 5,462,884 | 10/1995 | Taniguchi ................. 438/305 |
| 5,512,775 | 4/1996 | Cho . |
| 5,559,049 | 9/1996 | Cho ........................ 438/593 |
| 5,559,055 | 9/1996 | Chang et al. ............. 438/619 |
| 5,567,982 | 10/1996 | Bartelink . |
| 5,646,067 | 7/1997 | Gaul . |
| 5,665,632 | 9/1997 | Lur et al. ................. 438/422 |
| 5,716,861 | 2/1998 | Moslehi ................... 438/230 |
| 5,741,736 | 4/1998 | Orlowski et al. ......... 438/944 |
| 5,759,913 | 6/1998 | Fulford, Jr. et al. . |
| 5,783,864 | 7/1998 | Dawson et al. . |

METHOD OF FORMING AIR GAP SPACER FOR HIGH PERFORMANCE MOSFETS'

BACKGROUND OF THE INVENTION

1. Field of the Invention

This invention relates to integrated circuit fabrication and, more particularly, to forming transistors with air gaps arranged laterally adjacent the gate conductors to reduce capacitive coupling between the gate conductors and adjacent structures employed by the integrated circuit.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are then patterned to form a gate conductor with junction regions within the substrate adjacent to and on opposite sides of the gate conductor. The gate conductor and junction regions are then implanted with a light concentration of impurity dopant species to form lightly doped drain ("LDD") regions self-aligned to the gate conductor sidewall surfaces. Following the LDD implant, sidewall spacers composed of, e.g., silicon dioxide or silicon nitride are formed laterally adjacent to the opposed sidewall surfaces of the gate conductors. A second impurity implant, of the same type as the LDD implant but at a higher impurity concentration, is then used to form source/drain ("S/D") implant regions self-aligned with the lateral edges of the gate conductor sidewall spacers. A channel region between the source and the drain is protected from the implant species by the pre-existing gate conductor. When voltage above a certain threshold is applied to the gate of an enhancement-mode transistor, the channel between the source and drain becomes conductive and the transistor turns on.

The semiconductor industry has devoted much effort to reducing the feature sizes of and the separation between adjacent structures, such as conductive interconnects or transistors, in integrated circuits. Reducing the size of structures employed by integrated circuits has resulted in many advantages, including higher circuit speed and increased complexity. This reduction in size, however, and the commensurate increase in density, has also given rise to problems, such as unwanted capacitive coupling between adjacent structures on the integrated circuit device. Applying a voltage across a conductor gives rise to an electric field. As the separation between components of an integrated circuit device decreases, the electric field may cause charge to segregate into an adjacent conductor even in the absence of an applied voltage across the second conductor. Undesirable capacitive coupling may also occur between a gate conductor and an adjacent source/drain region, causing charge to segregate near the source/drain region rather than in the channel region of a transistor. Charge segregation in the absence of an applied voltage may give rise to a false signal (e.g., a logic 1 instead of a logic 0), resulting in improper operation or failure of the integrated circuit device.

An interlevel dielectric is generally deposited across the semiconductor topography following formation of transistors upon and within a semiconductor substrate. The interlevel dielectric is planarized, and contacts are formed through the interlevel dielectric to gate conductors and/or source/drain regions of various transistors. Unfortunately, the relative permittivity of the interlevel dielectric and the gate conductor sidewall spacers somewhat limits the minimum capacitive coupling that can be achieved between gate conductors and adjacent source/drain regions and between adjacent gate conductors. The permittivity $\epsilon$ of a material reflects the ability of the material to be polarized by an electric field. The capacitance between two layers of a conductive material separated by a dielectric is directly proportional to the permittivity of the dielectric. Typically, the permittivity of a material is described as its permittivity normalized to that of a vacuum, $\epsilon_0$. The relative permittivity, or dielectric constant, $\kappa$, of a material is therefore defined as $$\kappa = \epsilon/\epsilon_0$$

Silicon dioxide, with a dielectric constant of about 3.7–3.8, is often used as the interlevel dielectric and as the sidewall spacers. Adding fluorine to silicon dioxide or using an organic compound as the dielectric may produce materials with a dielectric constant lower than the dielectric constant of silicon dioxide without fluorine. In some cases, however, this reduction is still insufficient to eliminate capacitive coupling.

It would therefore be desirable to develop a technique for fabricating transistors with reduced capacitive coupling between adjacent gate conductors and between gate conductors and adjacent source/drain regions. An integrated circuit employing those transistors would undergo less charge segregation in undesirable places. As such, the integrated circuit would be more likely to function according to design. Furthermore, feature sizes of the integrated circuit could be reduced without concern over unwanted capacitive coupling. Therefore, reducing lateral capacitive coupling within an integrated circuit would allow for increased integration density of transistors and reduced propagation delay.

SUMMARY OF THE INVENTION

The problems outlined above are in large part solved by the technique hereof for fabricating a transistor in which air gaps are formed laterally adjacent the sidewall surfaces of the gate conductor. Because air has the lowest dielectric constant of any material ($\kappa$ equals approximately 1.0), the inclusion of air gaps between adjacent gate conductors reduces the polarizability of adjacent structures when a voltage is applied across a gate conductor. Minimizing capacitive coupling between adjacent transistors or between a gate and a source/drain region of a transistor improves device performance and reliability while allowing increased integration density of the device.

According to one embodiment of the present invention, a semiconductor substrate is provided. The semiconductor substrate may be rendered either p-type or n-type by lightly doping the semiconductor substrate. A gate dielectric is then formed upon the semiconductor substrate, followed by deposition of a polysilicon layer and a masking layer. Selective removal of the masking layer and the polysilicon may then be used to form a gate conductor underlying a masking surface and interposed between a pair of opposed sidewall surfaces.

A common procedure in the manufacture of transistors is to form lightly doped drain regions aligned with the sidewall surfaces of the gate conductor and then to form sidewall spacers on the gate conductor. The sidewall spacers serve to mask the LDD regions during a subsequent implantation of source/drain regions. In the present process, the S/D implant may be performed before the LDD implant. The gate conductor may serve as a mask such that the S/D implant regions are substantially aligned with the sidewall surfaces of the gate conductor. Following the S/D implant, an isotropic etch technique highly selective to polysilicon may be performed, reducing the lateral thickness (or width) of the polysilicon gate conductor while leaving the masking structure and gate dielectric as originally positioned. As a result, an "undercut" is formed beneath the masking structure laterally adjacent new sidewall surfaces of the gate conductor. An LDD implant may then be performed, with the lightly doped drain regions aligned to the resulting sidewall surfaces of the polysilicon gate conductor. The LDD implant energy is chosen so that the LDD implant traverses the masking structure and implant ions come to rest just below the substrate surface.

Alternatively, the separate S/D and LDD implants may be combined as a single implant step following etching of the polysilicon. A high-energy ion implant may be used to form deeply deposited S/D regions between gate conductors. Ions passing through the masking structure may be reduced in energy and concentration. As a result, LDD implant regions having average ion concentrations and average ion depths less than those of the S/D implant regions may be formed in areas underlying the gate conductors and aligned with the sidewall surfaces of the etched polysilicon.

Following the LDD implant, a second isotropic etch technique that exhibits high selectivity to the gate dielectric may be performed to expose the underlying S/D regions. Alternatively, and preferably, a directional plasma etch is used to remove oxide laterally outside the gate conductor. An interlevel dielectric may then be deposited across the semiconductor topography. Since opposite ends of the masking structure extend beyond the underlying gate conductor, interlevel dielectric is prevented from accumulating upon the sidewall surfaces of the gate conductor. The dielectric strikes the masking structure and deposits thereon before reaching the gate conductor sidewall surfaces. As a result, air gaps are formed laterally adjacent the sidewall surfaces of the gate conductor between the gate conductor and the interlevel dielectric. A chemical mechanical polishing step may then be used to remove the interlevel dielectric from above the gate conductors to form a surface substantially coplanar with the upper surface of the masking structure.

In an alternative embodiment, a refractory metal may be deposited upon the source/drain regions and upon the masking structure prior to depositing the interlevel dielectric. The orientation of the masking structure inhibits metal from depositing upon the gate conductor. The metal may be heated by placing the semiconductor topography in a high-temperature furnace or by rapid thermal processing. High-temperature heating may cause metal atoms to undergo cross-diffusion with silicon atoms in the source/drain regions and to react with the silicon atoms to form a metal suicide while the metal atoms deposited upon a non-oxide-based masking structure remain unreacted. Following silicide formation, a selective etch may be used to remove the unreacted metal.

Air has the lowest dielectric constant of any material. Therefore, the presence of air gaps laterally adjacent transistor gate conductors advantageously has the effect of decreasing capacitive coupling between adjacent gate conductors and between gate conductors and adjacent source/drain regions. A device produced by the method hereof thus may experience less charge accumulation in unwanted places. Consequently, an integrated circuit employing the device may have improved reliability and reduced opportunity for circuit failure. Additionally, reducing capacitive coupling by the addition of air gaps may provide for increased integration density of transistors within an integrated circuit.

BRIEF DESCRIPTION OF THE DRAWINGS

Other objects and advantages of the invention will become apparent upon reading the following detailed description and upon reference to the accompanying drawings in which.

Figure 1:
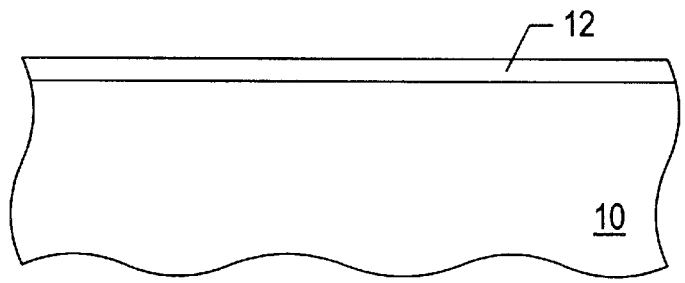
FIG. 1 is a cross-sectional view of a semiconductor topography, wherein a gate dielectric is formed across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
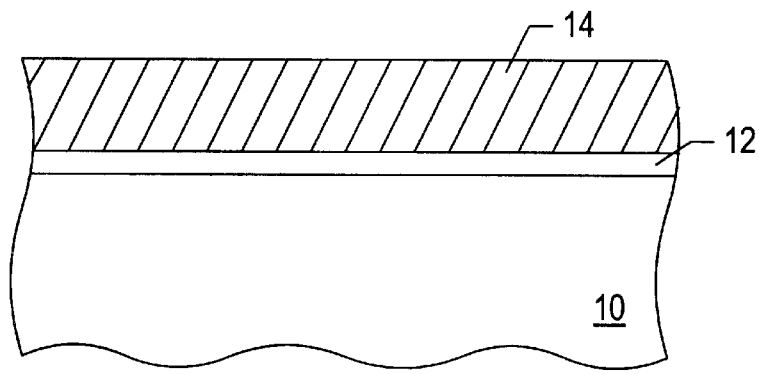
FIG. 2 is a cross-sectional view of the semiconductor topography, wherein a polysilicon layer is deposited across the gate dielectric, subsequent to the step of FIG. 1.
Figure 3:
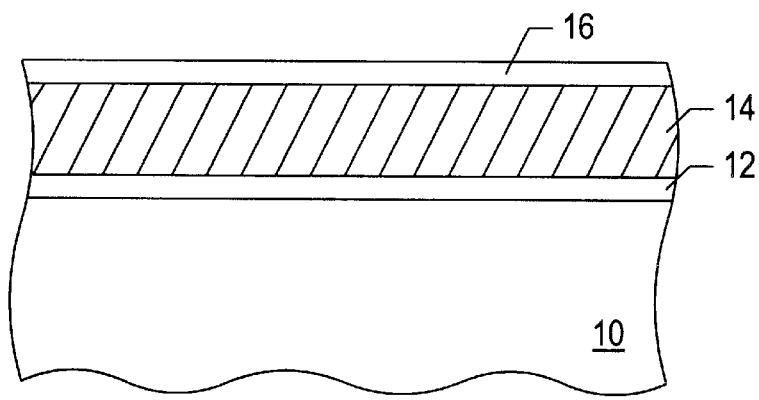
FIG. 3 is a cross-sectional view of the semiconductor topography, wherein a masking layer is deposited across the polysilicon layer, subsequent to the step of FIG. 2.

Turning now to the drawings, FIG. 1 illustrates a partial cross-sectional view of a semiconductor substrate 10. Substrate 10 typically comprises single crystalline silicon and may be provided with a light concentration of dopants, rendering it either p-type or n-type. Commonly used p-type dopants include boron and boron difluoride; commonly used n-type dopants include arsenic and phosphorous. Formed on the upper surface of substrate 10 is a gate dielectric 12. Gate dielectric 12 preferably comprises silicon dioxide ("oxide") formed by thermal oxidation of the silicon substrate. Thermal oxidation is typically achieved by exposing silicon substrate 10 to an oxygen-bearing ambient (e.g., oxygen or steam in an inert carrier gas) while heating in an oxidation furnace or rapid thermal anneal chamber. As shown in FIG. 2, a layer of polycrystalline silicon ("polysilicon") 14 may be deposited upon the gate dielectric 12. Polysilicon layer 14 may be formed by chemical vapor deposition ("CVD") from, e.g., a silane source. The polysilicon may be rendered conductive by forwarding dopants into polysilicon layer 14 possibly during later processing steps. FIG. 3 depicts the formation of a masking layer 16 on polysilicon layer 14. Masking layer 16 may comprise a silicon nitride ("nitride") layer CVD-deposited from, e.g., a silane- and ammonia-bearing plasma.

Figure 4:
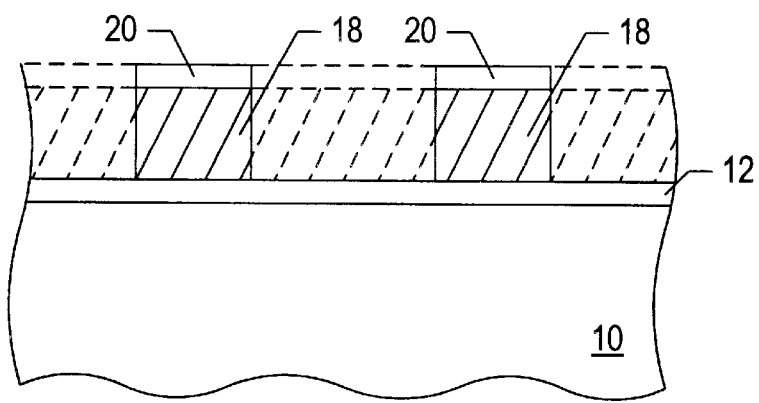
FIG. 4 is a cross-sectional view of the semiconductor topography, wherein portions of the masking layer and polysilicon layer are removed to define opposed sidewall surfaces of the polysilicon gate conductor and a masking structure, subsequent to the step of FIG. 3.
Figure 5:
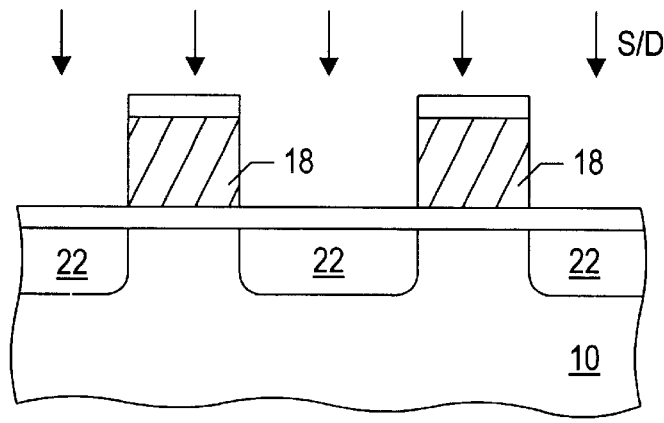
FIG. 5 is a cross-sectional view of the semiconductor topography, wherein a source/drain implant which is self-aligned to the opposed sidewall surfaces of the gate conductor is forwarded to the semiconductor substrate, subsequent to the step of FIG. 4.

Turning to FIG. 4, select portions of polysilicon layer 14 and masking layer 16 (shown by dashed lines) may be removed to form a gate conductor 18 with overlying masking structure 20 defined between a pair of opposed sidewall surfaces. Removal of those portions may involve using optical lithography and a dry plasma etch technique which is terminated before substantial portions of gate dielectric 12 are removed. Alternatively, portions of gate dielectric 12 may be etched as well to expose substrate 10. As shown in FIG. 5, a source/drain ("S/D") implant may then be forwarded into substrate 10 to form source/drain implant areas 22 self-aligned with the sidewall surfaces of gate conductor 18. A post-implant anneal (not shown) may be used to activate and position the implanted impurities.

Figure 6:
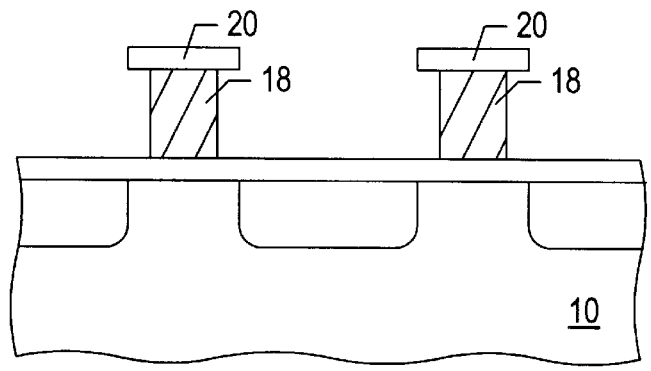
FIG. 6 is a cross-sectional view of the semiconductor topography, wherein the polysilicon layer is isotropically etched to form an undercut underneath the masking structure, subsequent to the step of FIG. 5.

Subsequently, an isotropic etch may be performed on exposed lateral surfaces of polysilicon gate conductors 18 such that the gate conductors are selectively narrowed to a pre-determined lateral thickness, as shown in FIG. 6. The isotropic etch technique preferably involves using a wet etchant that exhibits high selectivity for polysilicon such that gate conductors 18 may be etched without significant etching of the overlying masking structures 20. While masking structures 20 are preferably composed of nitride, they may be composed of any material that is resistant to attack by etchants that are highly selective for polysilicon. For example, masking structures 20 may comprise oxide, silicon oxynitride, or a metal. A photoresist masking layer may be optically patterned above masking structures 20 prior to the isotropic etch to define the regions of gate conductors 18 to be removed. In an alternative embodiment, both gate conductors 18 and gate dielectrics 12 may be selectively narrowed using an isotropic etch.

Figure 7:
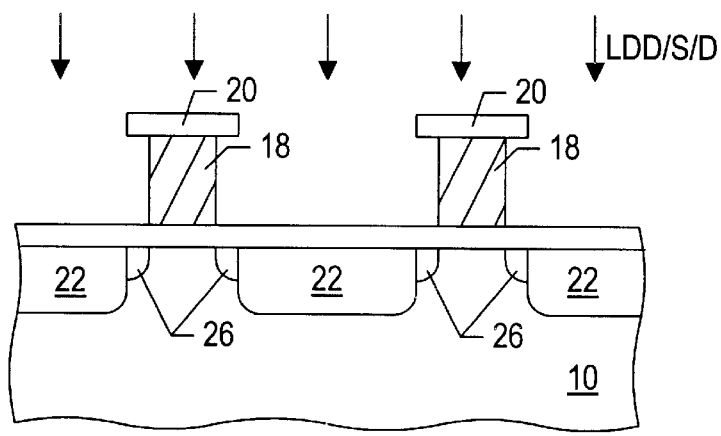
FIG. 7 is a cross-sectional view of the semiconductor topography, wherein a lightly doped drain implant which is self-aligned to the opposed sidewall surfaces of the poly-silicon layer is forwarded to the semiconductor substrate, subsequent to the step of FIG. 6.
Figure 8:
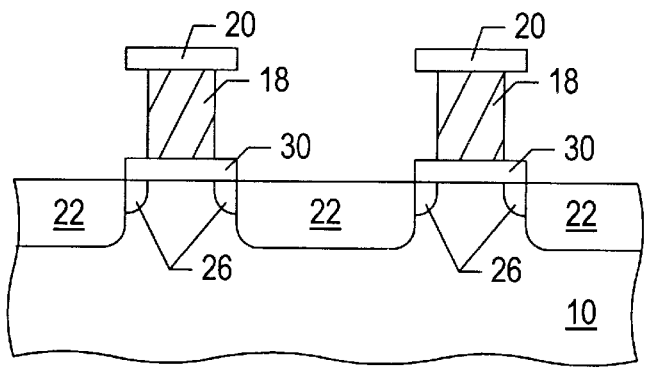
FIG. 8 is a cross-sectional view of the semiconductor topography, wherein the gate dielectric is removed from the area overlying the source/drain implant area, subsequent to the step of FIG. 7.

Turning now to FIG. 7, a lightly doped drain ("LDD") implant 26 that is self-aligned to the sidewall surfaces of the narrowed polysilicon layer 18 may be forwarded into semiconductor substrate 10 to form LDD implant areas 26. The dopants used for the LDD implant are of the same type as those used for the S/D implant but at a lower concentration. The LDD implant energy may also be less than the energy of the S/D implant such that the average depth of the LDD implant area is less than the average depth of the S/D implant area. An LDD post-anneal at a temperature lower than that the temperature of the S/D post-anneal may be performed at this time. A plasma etch selective for the gate oxide 12 may then be used to remove portions of gate oxide 12 from above S/D implant areas 22 to expose the S/D implant areas as shown in FIG. 8. Given a directional plasma etch, the remaining oxide 12 is self-aligned to masking structure 20. Masking structure 20 serves to block etching ions which perpendicularly impinge on exposed oxide 12 laterally spaced from a masking structure 20. Depending on the etch duration, a width of each narrowed gate oxide layer 30 is either equivalent to a width of a masking structure 20 or to a width of a gate conductor 18. Alternatively, the width of gate oxide 30 is between the width of masking structure 20 and the width of gate conductor 18.

In an alternative embodiment, the implant depicted in FIG. 7 may be used to form S/D implant areas 22 and LDD implant areas 26 concurrently, forgoing the processing step depicted in FIG. 5. A high-energy ion implant may be used to form S/D regions 22 self-aligned with the ends of masking structures 20. Masking structures 20 may be of sufficient thickness to reduce the concentration and energy of ions passing through the masking structures during implantation into semiconductor substrate 10. LDD implant regions 26 having average ion concentrations and average ion depths less than those of S/D implant regions 22 may be formed in areas self-aligned with the sidewall surfaces of gate conductors 18. Simultaneous formation of S/D and LDD implant regions may have several advantages. For example, reducing the number of fabrication steps eliminates opportunities for introducing contaminants into the process. As a result, devices having improved performance may be produced. Additionally, simplifying the process may convey the economic benefit of increased throughput.

Figure 9:
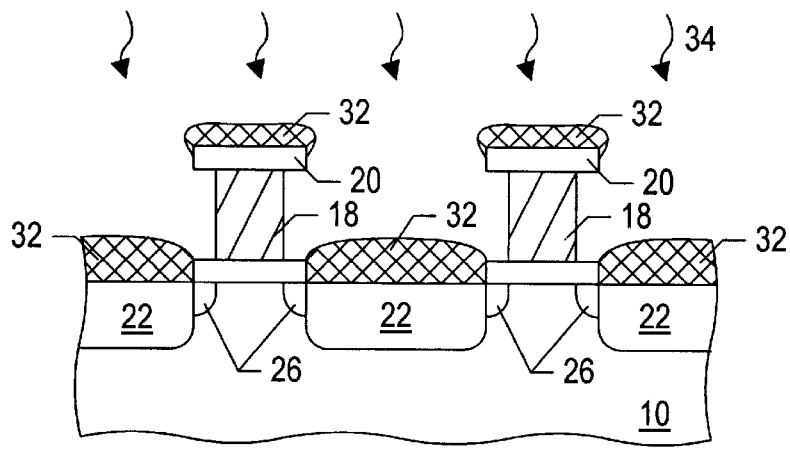
FIG. 9 is a cross-sectional view of the semiconductor topography, wherein a refractory metal is deposited across the masking structure and the source/drain implant area and heated to form a metal silicide, subsequent to the step of FIG. 8.
Figure 10:
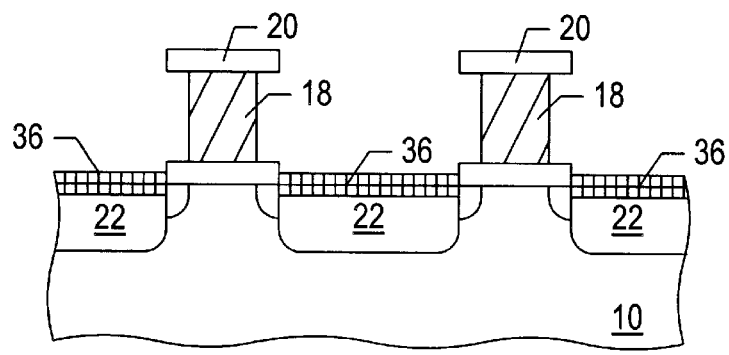
FIG. 10 is a cross-sectional view of the semiconductor topography, wherein a metal silicide layer is formed across the source/drain implant area and the unreacted metal is removed from the masking structure, subsequent to the step of FIG. 9.

FIGS. 9 and 10 depict optional steps for the formation of a metal silicide ("silicide") upon S/D implant areas 22. As shown in FIG. 9, a refractory metal 32 may be formed across masking structures 20 and S/D implant areas 22. Refractory metal 32 is preferably formed by sputter deposition from a metal target, e.g., a titanium or cobalt target. Sputter deposition is typically a "collimated" deposition, i.e., columns of material accumulate perpendicularly to horizontally- oriented surfaces. The deposited metal preferentially strikes the upper surfaces of masking structures 20 and deposits there without reaching surfaces below the masking structures. Therefore, the metal does not deposit on the vertically-oriented sidewall surfaces of gate conductor 18.

Subsequent to its deposition, metal layer 32 may be heated by exposing it to a form of radiation 34. Radiation 34 may be thermal radiation provided from a heated furnace. Alternatively, radiation 34 may be radiant light supplied from, e.g., an arc lamp or a tungsten-halogen lamp using a technique known as rapid thermal processing ("RTP"). Raising the temperature of metal layer 32 initiates reaction between metal atoms and silicon atoms of the silicon substrate 10 to form a metal silicide layer 36 above the S/D regions 22, as depicted in FIG. 10. The metal 32 arranged above the masking structures 20 remains unreacted and may be removed using, e.g., a wet etch selective to the unreacted metal.

Figure 11:
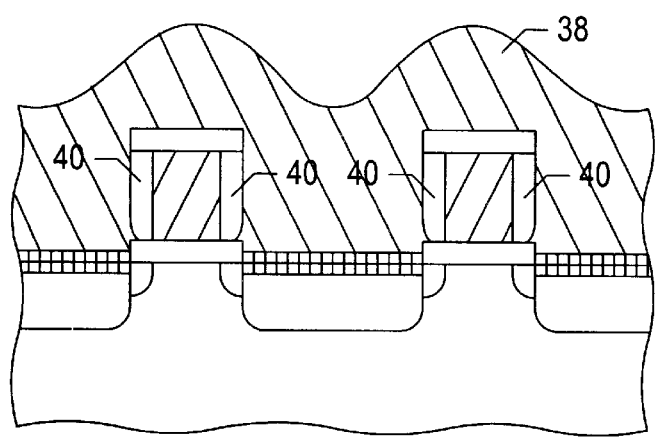
FIG. 11 is a cross-sectional view of the semiconductor topography, wherein an interlevel dielectric is deposited across the semiconductor topography such that air gaps are formed adjacent to the polysilicon layer, subsequent to the step of FIG. 10.
Figure 12:
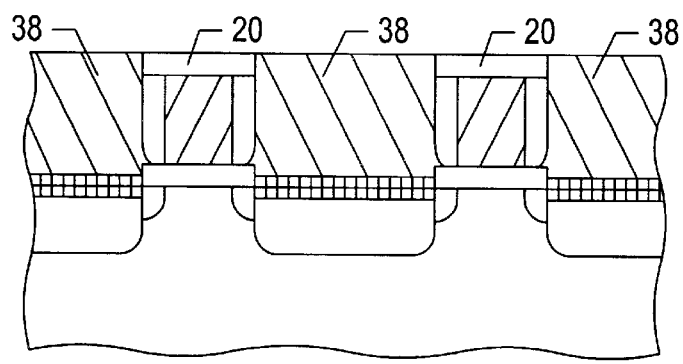
FIG. 12 is a cross-sectional view of the semiconductor topography, wherein the interlevel dielectric is planarized such that an upper surface of the interlevel dielectric is essentially flush with the upper surface of the masking structure.

Turning to FIG. 11, an interlevel dielectric 38 may be CVD deposited from, e.g., a TEOS source across exposed surfaces of the semiconductor topography. The presence of masking structures 20 above gate conductors 18 may prevent the accumulation of dielectric material upon the sidewall surfaces of gate conductors 18. As a result, air gaps 40 may be formed laterally adjacent to gate conductors 18 underneath the masking structures 20. Because air has the lowest dielectric constant of any material (i.e., κ=1.001 for air), the presence of air gaps 40 minimizes the capacitive coupling between adjacent gate conductors 18 and between gate conductors 18 and laterally adjacent S/D implant areas 22. Interlevel dielectric 38 may be removed down to a level substantially coplanar with the upper surface of masking structures 20 using, e.g., chemical mechanical polishing, as shown in FIG. 12.

It will be appreciated by those skilled in the art having the benefit of this disclosure that this invention is believed to provide a method for forming a transistor in which air gaps are formed adjacent the gate conductors to reduce the capacitive coupling between adjacent gate conductors and between a gate conductor and the adjacent source/drain regions. Further modifications and alternative embodiments of various aspects of the invention will be apparent to those skilled in the art in view of this description. For example, multiple transistors may be formed upon and within the semiconductor substrate between isolation regions, contacts may be made to the transistors and interconnect routing isolated above the transistors may be formed between the contacts. It is intended that the following claims be interpreted to embrace all such modifications and changes and, accordingly, the specification and drawings are to be regarded in an illustrative rather than a restrictive sense.

What is claimed is:

1. A method for forming a transistor, comprising:

forming a polysilicon gate conductor a dielectric spaced distance above a semiconductor substrate;

forming a masking structure which extends laterally across the gate conductor to a region directly above sidewall surfaces of the gate conductor;

implanting ions into the substrate in substantial lateral alignment with the masking structure to form source/drain implant areas;

isotropically etching the gate conductor sidewall surfaces such that the masking structure extends laterally beyond the etched conductor sidewall surfaces to form a lateral overhang of the masking structure beyond the etched conductor sidewall surfaces;

implanting ions in substantial lateral alignment with the etched conductor sidewall surfaces to form light doped drain implant areas; and using the masking structure as a deposition mask, depositing a dielectric upon said semiconductor substrate and said masking structure a spaced lateral distance from the etched conductor sidewall surfaces to form an air gap adjacent the etched conductor sidewall surfaces in a region directly beneath the lateral overhang.

2. The method of claim 1, wherein depositing comprises directionally depositing the dielectric approximately perpendicular to an upper surface of the masking structure to form the air gap.

3. The method of claim 1, wherein said masking structure is dissimilar in composition from said gate conductor, and wherein said etching comprises isotropically removing said polysilicon in lieu of substantially removing said masking structure.

4. The method of claim 1, further comprising:

depositing a metal across an upper surface of said masking structure and across said source/drain implant areas a spaced distance from the etched conductor sidewall surfaces; and heating said refractory metal to form a metal silicide upon and within the source/drain implant areas.

5. The method of claim 4, wherein the refractory metal is deposited from a metal-based target at an angle substantially perpendicular to the upper surface of said masking structure.

6. The method of claim 4, wherein said depositing comprises using the masking structure to block metal from being deposited upon the etched conductor sidewall surfaces.

7. A method for forming a transistor, comprising:

forming a polysilicon gate conductor a dielectric spaced distance above a semiconductor substrate;

forming a masking structure which extends laterally across the gate conductor to a region directly above sidewall surfaces of the gate conductor;

isotropically etching the gate conductor sidewall surfaces such that the masking structure extends laterally beyond the etched conductor sidewall surfaces to form a lateral overhang of the masking structure beyond the etched conductor sidewall surfaces;

implanting ions partially blocked by the masking structure to concurrently form source/drain implant areas substantially aligned with the masking structure and lightly doped drain implant areas substantially aligned with the etched conductor sidewall surfaces; and using the masking structure as a deposition mask, depositing a dielectric upon said semiconductor substrate and said masking structure a spaced lateral distance from the etched conductor sidewall surfaces to form an air gap adjacent the etched conductor sidewall surfaces in a region directly beneath the lateral overhang.

8. The method of claim 7, wherein depositing comprises directionally depositing the dielectric approximately perpendicular to an upper surface of the masking structure to form the air gap.

9. The method of claim 7, wherein said masking structure is dissimilar in composition from said gate conductor, and wherein said etching comprises isotropically removing said polysilicon in lieu of substantially removing said masking structure.

10. The method of claim 7, further comprising: depositing a metal across an upper surface of said masking structure and across said source/drain implant areas a spaced distance from the etched conductor sidewall surfaces; and heating said refractory metal to form a metal silicide upon and within the source/drain implant areas.

11. The method of claim 10, wherein the refractory metal is deposited from a metal-based target at an angle substantially perpendicular to the upper surface of said masking structure.

12. The method of claim 10, wherein said depositing comprises using the masking structure to block metal from being deposited upon the etched conductor sidewall surfaces.

* * * * *

UNITED STATES PATENT AND TRADEMARK OFFICE
CERTIFICATE OF CORRECTION

PATENT NO. : 5,869,379

DATED : February 9, 1999

INVENTOR(S) : Mark I. Gardner et al.

It is certified that error appears in the above-identified patent and that said Letters Patent is hereby corrected as shown below:

On the title page, Item [54], and Column 1,

Please delete the word "MOSFETS'" and substitute therefor --MOSFETS--.

Signed and Sealed this

First Day of June, 1999

*Attest:*

*Attesting Officer*

Q. TODD DICKINSON

Acting Commissioner of Patents and Trademarks